United States Patent [19]

Asano

[11] Patent Number: 5,987,339
[45] Date of Patent: Nov. 16, 1999

[54] RECEIVING PORTION OF RADIO COMMUNICATION DEVICE

[75] Inventor: Nobuo Asano, Yokohama, Japan

[73] Assignee: Matsushita Electric Industrial Co., Ltd., Osaka, Japan

[21] Appl. No.: 08/956,354

[22] Filed: Oct. 23, 1997

[30] Foreign Application Priority Data

Dec. 27, 1996 [JP] Japan ..................... 8-356746

[51] Int. Cl.⁶ .................................................. H04Q 7/20
[52] U.S. Cl. ................... 455/574; 455/38.3; 455/343; 455/550; 370/311
[58] Field of Search .................... 455/38.3, 208, 455/255, 257, 258, 259, 260, 265, 315, 343, 550, 574, 575; 370/311, 324; 375/354, 359, 374; 331/2, 18, 25, 49

[56] References Cited

U.S. PATENT DOCUMENTS 5,737,323  4/1998  Lansdowne ........................ 455/343
5,742,650  4/1998  Nuckolls et al. ................... 455/343

FOREIGN PATENT DOCUMENTS

0586256A2  9/1994  European Pat. Off. .
8251656    9/1996  Japan .
8251665    9/1996  Japan .
2297883    8/1996  United Kingdom .
2297884    8/1996  United Kingdom .

*Primary Examiner*—Dwayne D. Bost
*Assistant Examiner*—Nay A. Maung
*Attorney, Agent, or Firm*—Pollock, Vande Sande & Amernick

[57] ABSTRACT

A receiving portion of a radio communication device includes a circuit periodically moving into a sleep mode of operation. The circuit periodically moves out of the sleep mode of operation in response to a re-activation signal. A first clock signal is generated. Clock pulses in the first clock signal are counted. The re-activation signal is generated each time the number of the counted clock pulses in the first clock signal reaches an updatable number. A second clock signal is generated which has a frequency higher than a frequency of the first clock signal. Clock pulses in the second clock signal are counted during every time interval determined by the first clock signal. An error of the frequency of the first clock signal with respect to the frequency of the second clock signal is calculated on the basis of a result of the counting of clock pulses in the second clock signal. The updatable number is set in response to the calculated error of the frequency of the first clock signal.

10 Claims, 5 Drawing Sheets

RECEIVING PORTION OF RADIO COMMUNICATION DEVICE

BACKGROUND OF THE INVENTION

1. Field of the Invention

This invention relates to a receiving portion of a radio communication device such as a mobile telephone set.

2. Description of the Related Art

Some mobile telephone sets have receiving portions which periodically fall into a sleep mode of operation. When the receiving portion is in the sleep mode of operation, most of circuits in the receiving portion are deactivated to save electric power. At an expected timing of the transmission of polling signals from a base station, the receiving portion changes from the sleep mode of operation to an awake mode (a normal mode or a stand-by mode) of operation.

UK patent application GB 2297884 A corresponding to Japanese published unexamined patent application 8-251656 discloses a power saving arrangement in a mobile telephone. In UK patent application GB 2297884 A, the mobile telephone has a high frequency system clock, and a processor arranged to process polling signals received while the telephone is in its stand-by condition.

When polling signals are not being received, it is possible for the telephone to be placed in a sleep condition by deactivating the system clock. Re-activation occurs in response to a calibrated number of clock cycles produced by a lower frequency sleep clock. Upon re-activation, system clock counters specifying sub-frame periods and frame periods are re-loaded so that they can be re-activated at the required phase. The phase of these counters is compared with signals received from base stations and modifications are made to system counts as required. The extent to which modifications are required is also used to re-calibrate the sleep clock.

In the power saving arrangement of UK patent application GB 2297884 A, the timing of re-activation is determined by the sleep clock. The re-activation includes re-activation of received-signal processing. Accordingly, a minimum increment or a minimum decrement (a minimum variation unit) of the timing of re-activation of the received-signal processing corresponds to the period of the sleep clock. Thus, it is difficult to vary the timing of re-activation of the received-signal processing by a unit shorter than the period of the sleep clock.

In the power saving arrangement of UK patent application GB 2297884 A, the sleep clock is re-calibrated in response to the result of the comparison between the phase of the system clock counters and the phase of the signals received from the base stations while a frequency error of the sleep clock is not detected.

SUMMARY OF THE INVENTION

It is an object of this invention to provide an improved receiving portion of a radio communication device.

A first aspect of this invention provides a receiving portion of a radio communication device, comprising a circuit periodically moving into a sleep mode of operation, the circuit periodically moving out of the sleep mode of operation in response to a re-activation signal; first means for generating a first clock signal; second means for counting clock pulses in the first clock signal and generating the re-activation signal each time the number of the counted clock pulses in the first clock signal reaches an updatable number; third means for generating a second clock signal having a frequency higher than a frequency of the first clock signal; fourth means for counting clock pulses in the second clock signal during every time interval determined by the first clock signal; fifth means for calculating an error of the frequency of the first clock signal with respect to the frequency of the second clock signal on the basis of a result of the counting by the fourth means; and sixth means for setting the updatable number in response to the error calculated by the fifth means.

A second aspect of this invention is based on the first aspect thereof, and provides a receiving portion further comprising a reception processing unit; seventh means for activating the third means in response to the re-activation signal and then activating the reception processing unit at a moment which follows a moment of the activation of the third means by an updatable time; and eighth means for setting the updatable time in response to the error calculated by the fifth means.

A third aspect of this invention is based on the first aspect thereof, and provides a receiving portion further comprising a reception processing unit periodically moving into a sleep mode of operation, the reception processing unit periodically moving out of the sleep mode of operation in response to the re-activation signal.

A fourth aspect of this invention is based on the third aspect thereof, and provides a receiving portion further comprising seventh means for comparing a segment of the error calculated by the fifth means with a predetermined value corresponding to a multiple-path search window width used in the reception processing unit; and eighth means for changing the updatable number in response to a result of the comparing by the seventh means.

A fifth aspect of this invention provides a receiving portion of a radio communication device, comprising a circuit periodically moving into a sleep mode of operation, the circuit periodically moving out of the sleep mode of operation in response to a re-activation signal; first means for generating a first clock signal; a frequency divider for generating a second clock signal in response to the first clock signal generated by the first means, the second clock signal having a frequency lower than a frequency of the first clock signal; second means for counting clock pulses in the first clock signal and generating the re-activation signal each time the number of the counted clock pulses in the first clock signal reaches an updatable number; third means for generating a third clock signal having a frequency higher than the frequency of the first clock signal; fourth means for counting clock pulses in the third clock signal during every time interval determined by the second clock signal; fifth means for calculating an error of the frequency of the first clock signal with respect to the frequency of the third clock signal on the basis of a result of the counting by the fourth means; and sixth means for setting the updatable number in response to the error calculated by the fifth means.

A sixth aspect of this invention is based on the fifth aspect thereof, and provides a receiving portion further comprising a reception processing unit; seventh means for activating the third means in response to the re-activation signal and then activating the reception processing unit at a moment which follows a moment of the activation of the third means by an updatable time; and eighth means for setting the updatable time in response to the error calculated by the fifth means.

A seventh aspect of this invention is based on the fifth aspect thereof, and provides a receiving portion further comprising a reception processing unit periodically moving into a sleep mode of operation, the reception processing unit periodically moving out of the sleep mode of operation in response to the re-activation signal.

An eighth aspect of this invention is based on the seventh aspect thereof, and provides a receiving portion further comprising seventh means for comparing a segment of the error calculated by the fifth means with a predetermined value corresponding to a multiple-path search window width used in the reception processing unit; and eighth means for changing the updatable number in response to a result of the comparing by the seventh means.

A ninth aspect of this invention provides a receiving portion of a radio communication device, comprising a controller periodically moving into a sleep mode of operation, the controller periodically moving out of the sleep mode of operation in response to a re-activation signal; first means for generating a first clock signal; second means for counting clock pulses in the first clock signal and generating the re-activation signal each time the number of the counted clock pulses in the first clock signal reaches an updatable number; third means for generating a second clock signal having a frequency higher than a frequency of the first clock signal; and fourth means for counting clock pulses in the second clock signal during every time interval determined by the first clock signal; wherein the controller comprises fifth means for calculating an error of the frequency of the first clock signal with respect to the frequency of the second clock signal on the basis of a result of the counting by the fourth means, and sixth means for setting the updatable number in response to the error calculated by the fifth means.

A tenth aspect of this invention provides a receiving portion of a radio communication device, comprising a circuit periodically moving into a sleep mode of operation, the circuit periodically moving out of the sleep mode of operation in response to a re-activation signal; first means for generating a first clock signal; second means for generating a second clock signal having a frequency higher than a frequency of the first clock signal, the second clock signal having a frequency accuracy higher than a frequency accuracy of the first clock signal; third means for periodically detecting a relation between the frequency of the first clock signal and the frequency of the second clock signal; and fourth means for periodically generating the re-activation signal in response to the first clock signal at a timing depending on the relation detected by the third means.

DESCRIPTION OF THE PREFERRED EMBODIMENTS

A prior-art power saving arrangement for a mobile telephone which is disclosed in UK patent application GB 2297884 A will be further explained for a better understanding of this invention.

Figure 1:
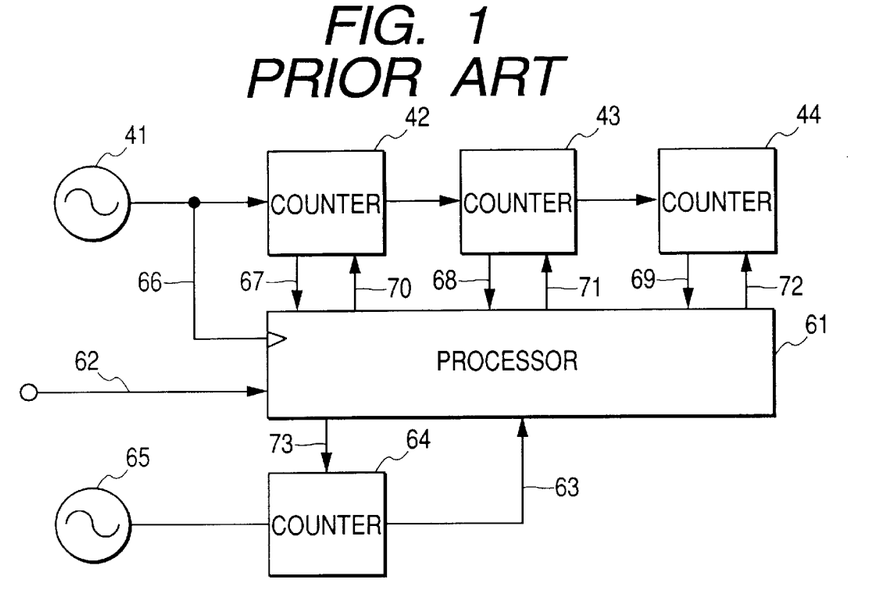
FIG. 1 is a block diagram of a prior-art power saving arrangement for a mobile telephone.

FIG. 1 shows the prior-art power saving arrangement of UK patent application GB 2297884 A which includes a system clock 41 and its associated counters 42, 43, and 44. The system clock 41 outputs a clock signal having a frequency of 16.8 MHz. The system clock 41 and the counters 42, 43, and 44 communicate with a digital signal processor 61. The processor 61 receives external timing signals from base stations via an input line 62. The processor 61, the system clock 41, and the counters 42, 43, and 44 can be placed into a sleep mode, during which the system clock 41 ceases to operate until re-activation by an interrupt signal supplied on an interrupt line 63 to the processor 61 from an adjustable counter 64. The adjustable counter 64 receives sleep clock pulses from a low frequency sleep clock 65 which operates at approximately 32 kHz.

In the prior-art power saving arrangement of FIG. 1, the clock signal fed from the system clock 41 clocks the processor 61 via a clocking line 66. The counter 42 counts clock pulses from the system clock 41 to generate indications of the start of sub-frame periods, that are supplied to the processor 61 over a data line 67. The sub-frame period corresponds to a frequency of 336 kHz. The reduced-frequency clock pulses are supplied from the counter 42 to the counter 43, which supplies indications of the start of frame periods to the processor 61 over a data line 68. The frame period corresponds to a frequency of 50 Hz. The counter 44 receives the output signal from the counter 43, providing indications of the start of superframe periods which are supplied to the processor 61 over a data line 69. The superframe period corresponds to a frequency of 1.38 Hz.

In the prior-art power saving arrangement of FIG. 1, the processor 61 is designed to supply new count values to the counters 42, 43, and 44 over data lines 70, 71, and 72 respectively. Thus, after the system clock 41 has been placed in its sleep mode, the system phase can be restored by downloading new count values to the counters 42, 43, and 44. Then, the counters 42, 43, and 44 can be re-activated so as to continue counting pulses directly or indirectly generated by the system clock 41.

In the prior-art power saving arrangement of FIG. 1, the processor 61 serves to check whether the counters 42, 43, and 44 are in phase with signals received from base stations via the input line 62. Thus, the processor 61 can compare its local system phase with the network system phase and, where appropriate, modify count values via the data lines 70, 71, and 72 so as to bring the count values into phase with the overall network.

In the prior-art power saving arrangement of FIG. 1, the sleep clock 65 generates sleep clock pulses that are counted by the variable counter 64. The processor 61 supplies a count value to the variable counter 64 via a data line 73. Therefore, the variable counter 64 is controlled by the processor 61. The variable counter 64 produces activation pulses by reducing the pulse frequency of the sleep clock. After counting a number of sleep pulses defined by the value supplied over the data line 73, the variable counter 64 outputs a re-activation pulse over the interrupt line 63. The re-activation pulse instructs the processor 61 to re-activate the system if the system has been placed in its sleep mode.

The prior-art power saving arrangement of FIG. 1 operates as follows. During the sleep mode of operation, the system clock 41 is inactive and the processor 61 is waiting for a re-activation pulse. When the processor 61 receives a re-activation pulse from the variable counter 64 via the interrupt line 63, the system clock 41 is activated. After the activation of the system clock 41, a short interval is provided during which the circuitry is allowed to power up and stabilize so that normal processing can be resumed.

Prior to the resumption of the normal processing, the counters 42, 43, and 44 are re-loaded with new values via the data lines 70, 71, and 72 to re-establish operation of the processor 61 and the system clock 41 as if they had not been placed in the sleep mode. Thus, the processor 61 and the system clock 41 are placed in the sleep mode until the re-activation time point. The period between re-activation time points is specified in terms of a calibrated number of sleep clock pulses. After the counters 42, 43, and 44 have been loaded with the new values, they are enabled at the appropriate time point so as to bring them into phase with the operating environments.

The phase of the counters 42, 43, and 44 is compared with external timing signals received over the input line 62. The duration of a sleep clock pulse will not tend to represent an integer number of system clock pulses. Thus, the re-activation time points will tend to drift with reference to the optimum time point defined in terms of system clock pulses, and therefore re-calibration is required on a continual basis. On each cycle, a re-calibration procedure is effected by making reference to the extent to which the counters 42, 43, and 44 are out of phase with the external timing signals received over the input line 62. The phase comparison provides a determination whether the sleep clock has slowed down or speeded up. When the sleep clock has slowed down, more counts are required by the variable counter 64 to re-activate the system clock at the optimum time point. When the sleep clock has speeded up, fewer counts are required by the variable counter 64 to re-activate the system clock at the optimum time point.

Even while the sleep clock 65 remains oscillating at a constant frequency, the activation time point will tend to drift. Therefore, occasionally a cycle is required in which fewer counts are made by the variable counter 64 or more counts are made by the variable counter 64. Then, the count is re-adjusted on the next cycle and the process continues. Thus, the activation time point, as determined by the variable counter 64, may drift slightly with reference to the optimum time point defined in terms of system clock pulses. On the other hand, the activation time point, defined by the sleep clock, does not drift beyond an extent to which the processor 61 can recover the situation with reference to signals received externally.

After the sleep clock is calibrated and a new count number is supplied to the variable counter 64, a decision is made as to whether or not the sleep mode of operation should be maintained. Specifically, data received in the polling burst is examined. When this data requests the establishment of a connection to a base station, it is decided that the sleep mode of operation should not be maintained. In this case, the active mode of operation is started in which the system clock 41 is kept operative and measures are undertaken to establish a call. When the establishment of a connection to a base station is not requested, it is decided that the sleep mode of operation should be maintained. In this case, the system clock 41 is deactivated and the system returns to its sleep mode.

In the prior-art power saving arrangement of FIG. 1, the period between re-activation time points is specified in terms of a calibrated number of sleep clock pulses. The re-activation includes re-activation of received-signal processing. Accordingly, a minimum increment or a minimum decrement (a minimum variation unit) of the timing of re-activation of the received-signal processing corresponds to the period of the sleep clock. Thus, it is difficult to vary the timing of re-activation of the received-signal processing by a unit shorter than the period of the sleep clock.

In the power saving arrangement of FIG. 1, the sleep clock is re-calibrated in response to the result of the comparison between the phase of the counters 42, 43, and 44 and the phase of the external timing signals received via the input line 62 while a 20 frequency error of the sleep clock is not detected.

First Embodiment

Figure 2:
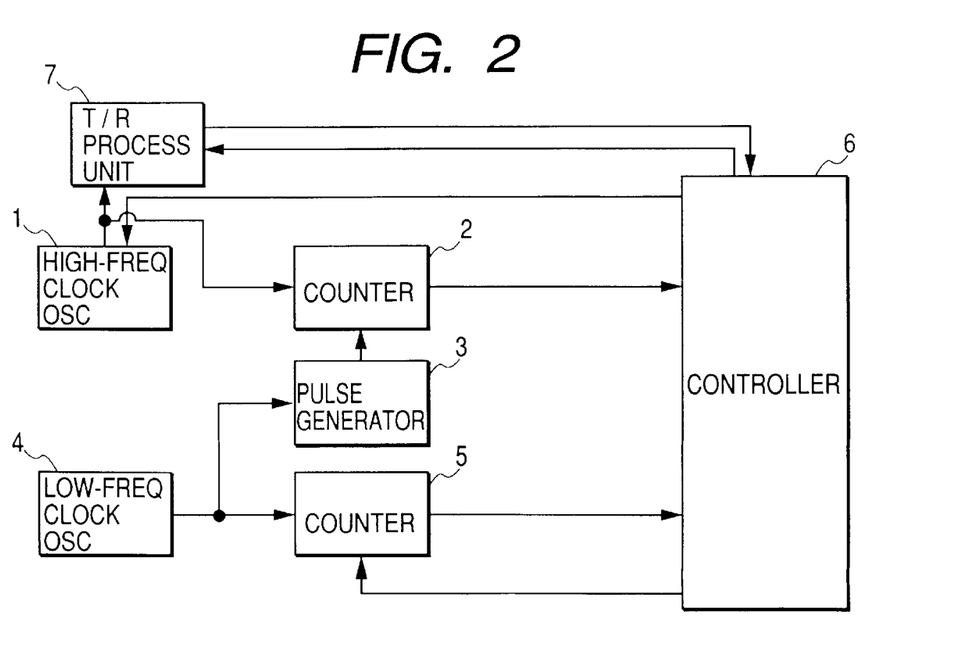
FIG. 2 is a block diagram of a portion of a radio communication device according to a first embodiment of this invention.

With reference to FIG. 2, a radio communication device of a first embodiment of this invention includes a high-frequency clock oscillator 1, a counter 2, a pulse generator 3, a low-frequency clock oscillator 4, a counter 5, a controller 6, and a transmission/reception processing unit 7. For example, the radio communication device of FIG. 2 corresponds to a mobile station in a radio communication network.

The high-frequency clock oscillator 1 is connected to the counter 2, the controller 6, and the transmission/reception processing unit 7. The counter 2 is connected to the pulse generator 3 and the controller 6. The pulse generator 3 is connected to the low-frequency clock oscillator 4. The low-frequency clock oscillator 4 is connected to the counter 5. The counter 5 is connected to the controller 6. The controller 6 is connected to the transmission/reception processing unit 7.

The high-frequency clock oscillator 1 generates a high-frequency clock signal having a frequency of, for example, 12.5 MHz. It is preferable that the high-frequency clock oscillator 1 has a high frequency stability and a high frequency accuracy. The frequency stability and the frequency accuracy of the high-frequency clock oscillator 1 are better than those of the low-frequency clock oscillator 4. For example, the high-frequency clock oscillator 1 uses a temperature-compensated crystal oscillator. The high-frequency clock oscillator 1 outputs the high-frequency clock signal to the counter 2 and the transmission/reception processing unit 7. The transmission/reception processing unit 7 processes a transmission signal and a received signal in response to the high-frequency clock signal. Specifically, the transmission/reception processing unit 7 demodulates a received radio signal into a baseband signal. The transmission/reception processing unit 7 informs the controller 6 of the baseband signal which generally contains a polling signal.

The low-frequency clock oscillator 4 generates a low-frequency clock signal having a frequency lower than the frequency of the high-frequency clock signal generated by the high-frequency clock oscillator 1. The frequency of the low-frequency clock signal is equal to, for example, 500 kHz. The low-frequency clock oscillator 4 outputs the low-frequency clock signal to the pulse generator 3 and the counter 5.

The pulse generator 3 periodically outputs a pulse to the counter 2 in response to the low-frequency clock signal. Every pulse outputted from the pulse generator 3 corresponds in time length (duration or pulse width) to a predetermined number of pulses of the low-frequency clock signal. The predetermined number is equal to, for example, 27,500. The pulse generator 3 includes, for example, a counter or a frequency divider.

The counter 2 is preferably of the 20-bit type. The counter 2 counts pulses of the high-frequency clock signal during a period equal to the width (the duration) of each pulse outputted from the pulse generator 3. Thus, the counter 2 detects or measures the width (the duration) of each pulse outputted from the pulse generator 3. The number of counted pulses which occurs at the end of every count period represents the width (the duration) of each pulse outputted from the pulse generator 3. The counter 2 informs the controller 6 of the counted pulse number which represents the width (the duration) of each pulse outputted from the pulse generator 3. Immediately after the counter 2 informs the controller 6 of the width (the duration) of each pulse outputted from the pulse generator 3, the counter 2 resets the counted pulse number.

The counter 5 counts pulses of the low-frequency clock signal, and periodically generates a re-activation signal (a restarting signal) in response to the low-frequency clock signal. The counter 5 outputs the re-activation signal to the controller 6. Specifically, the counter 5 is loaded with information of an updatable reference number. Each time the number of counted pulses of the low-frequency clock signal reaches the reference number, the counter 5 outputs a re-activation signal and then resets the number of counted pulses.

The controller 6 includes a DSP (digital signal processor), a CPU (central processing unit), or a similar circuit having a combination of an input/output port, a processing section, a ROM, and a RAM. The controller 6 operates in accordance with a program stored in its internal ROM.

The controller 6 can change between a sleep mode of operation and an awake mode (a normal mode) of operation. According to the program, the controller 6 changes from the sleep mode of operation to the awake mode of operation in response to the re-activation signal outputted from the counter 5. According to the program, the controller 6 controls activation and deactivation of the high-frequency clock oscillator 1 and the transmission/reception processing unit 7. According to the program, the controller 6 periodically calculates a new reference number and periodically loads the counter 5 with information of the new reference number.

The radio communication device of FIG. 2 can be in an intermittently receiving mode of operation which has the alternation of an awake mode (a normal mode) of operation and a sleep mode of operation. During the intermittently receiving mode of operation, the low-frequency clock oscillator 4 and the counter 5 continue to be active. Thus, the low-frequency clock oscillator 4 and the counter 5 remain operating even during the sleep mode of operation.

In the case where the frequencies of the high-frequency clock signal and the low-frequency clock signal are accurately equal to 12.5 MHz and 500 kHz respectively, the high-frequency clock oscillator 1 generates 25 pulses while the low-frequency clock oscillator 4 generates one pulse. An error of the frequency of the low-frequency clock signal with respect to the frequency of the high-frequency clock signal is corrected as follows. The counter 2 counts pulses of the high-frequency clock signal during every period corresponding in time length to the predetermined number (for example, 27,500) of pulses of the low-frequency clock signal. The number of counted pulses which occurs at the end of every count period represents the time length corresponding to the predetermined number (for example, 27,500) of pulses of the low-frequency clock signal. The counter 2 informs the controller 6 of the counted pulse number which represents the time length corresponding to the predetermined number (for example, 27,500) of pulses of the low-frequency clock signal. According to the program, the controller 6 compares the counted pulse number with a predetermined pulse number (equal to, for example, 687,500=25×27,500) which corresponds to a condition where an error is absent from the frequency of the low-frequency clock signal with respect to the frequency of the high-frequency clock signal. Then, the controller 6 calculates a mean frequency error or an average frequency error of the low-frequency clock signal per pulse of the low-frequency clock signal from the result of the above-mentioned comparison. According to the program, the controller 6 periodically sets a new reference number in response to the calculated mean frequency error, and periodically loads the counter 5 with information of the new reference number. In addition, the controller 6 controls activation of the high-frequency clock oscillator 1 and the transmission/reception processing unit 7.

Figure 3:
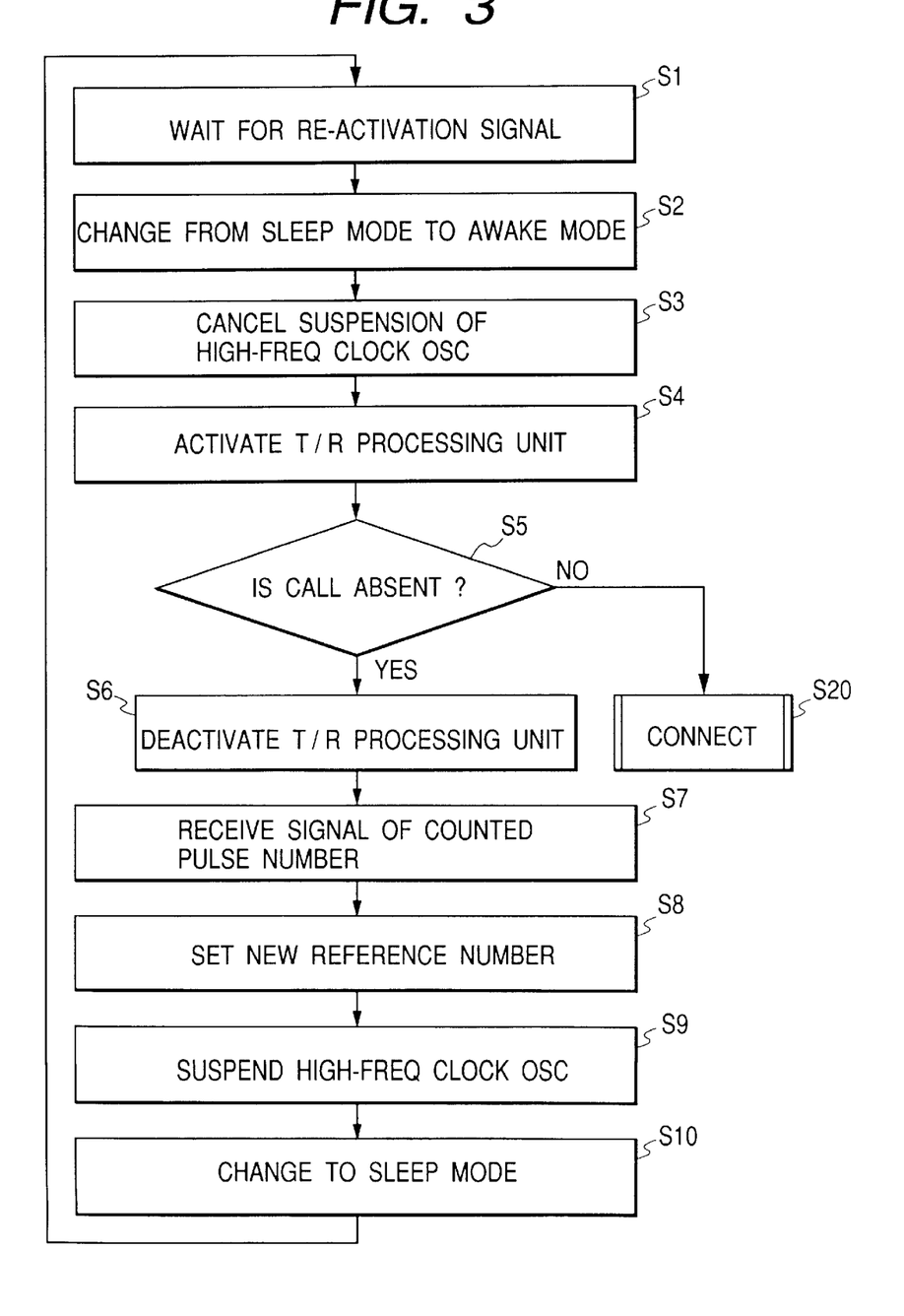
FIG. 3 is a flowchart of a segment of a program related to a controller in FIG. 2.

As previously indicated, the controller 6 operates in accordance with a program stored in its internal ROM. FIG. 3 is a flowchart of a segment of the program which relates to the intermittently receiving mode of operation.

As shown in FIG. 3, a first step S1 of the program segment waits for a re-activation signal outputted from the counter 5. When the step S1 detects that a re-activation signal is outputted from the counter 5, the program advances from the step S1 to a step S2.

The step S2 changes the controller 6 from a sleep mode of operation to an awake mode (a normal mode) of operation.

A step S3 following the step S2 cancels suspension of operation of the high-frequency clock oscillator 1, and hence re-activates the high-frequency clock oscillator 1. In addition, the step S3 cancels suspension of operation of the counter 2 and the pulse generator 3, and hence re-activates the counter 2 and the pulse generator 3.

A step S4 subsequent to the step S3 changes the transmission/reception processing unit 7 from a sleep mode of operation to an awake mode (a normal mode) of operation. In other words, the step S4 re-activates the transmission/reception processing unit 7. Upon a change from the sleep mode of operation, the transmission/reception processing unit 7 makes preparations for the awake mode of operation. After the preparations have been made, the transmission/reception processing unit 7 falls into the awake mode of operation in which the transmission/reception processing unit 7 receives a polling radio signal from a base station and demodulates the received signal into a baseband signal. The step S4 receives the baseband signal from the transmission/reception processing unit 7.

In addition, the step S4 reads out information of the fractional part of a value "Q" from the RAM within the controller 6. The value "Q" has been calculated during the immediately preceding execution cycle of the program segment. The step S4 controls the moment of the re-activation of the transmission/reception processing unit 7 in response to the fractional part of the value "Q". Specifically, the step S4 delays the moment of the re-activation of the transmission/reception processing unit 7 from an uncorrected reference moment by a time corresponding to the fractional part of the value "Q".

A step S5 following the step S4 decides whether a call to the present mobile station is present or absent by referring to the baseband signal. When it is decided that a call to the present mobile station is present, the program advances from the step S5 to a block S20 for establishing a connection to the base station. When it is decided that a call to the present mobile station is absent, the program advances from the step S5 to a step S6.

The step S6 changes the transmission/reception processing unit 7 to the sleep mode of operation. In other words, the step S6 deactivates the transmission/reception processing unit 7.

A step S7 subsequent to the step S6 receives a signal from the counter 2 which represents a counted pulse number indicative of a time length corresponding to the predetermined number (for example, 27,500) of pulses of the low-frequency clock signal.

A step S8 following the step S7 calculates a ratio between the counted pulse number and the predetermined pulse number (equal to, for example, 687,500=25×27,500). The predetermined pulse number corresponds to a condition where an error is absent from the frequency of the low-frequency clock signal with respect to the frequency of the high-frequency clock signal. Then, the step S8 calculates a mean frequency error or an average frequency error "n" of the low-frequency clock signal per pulse of the low-frequency clock signal from the calculated pulse-number ratio. Specifically, the mean frequency error "n" is expressed as "n=Cp/Pp" where "Cp" denotes the counted pulse number and "Pp" denotes the predetermined pulse number (equal to, for example, 687,500=25 ×27,500). In this case, the actual frequency of the low-frequency clock signal is given by "500·n" kHz. The step S8 calculates a value "Q" which is expressed as "Q=L·500·n" where "L" denotes a desired time interval measured by the counter 5. The value "Q" is composed of an integral part and a fractional part. The step S8 sets a new reference number to the integral part of the value "Q". The step S8 loads the counter 5 with information of the new reference number. The counter 5 uses the new reference number in generating a next re-activation signal. The step S8 stores information of the fractional part of the value "Q" into the RAM within the controller 6 as a timing control parameter for a next execution cycle of the program segment.

A step S9 subsequent to the step S8 deactivates the high-frequency clock oscillator 1. In other words, the step S9 suspends operation of the high-frequency clock oscillator 1.

A step S10 following the step S9 changes the controller 6 to the sleep mode of operation. After the step S10, the program returns to the step S1.

Figure 4:
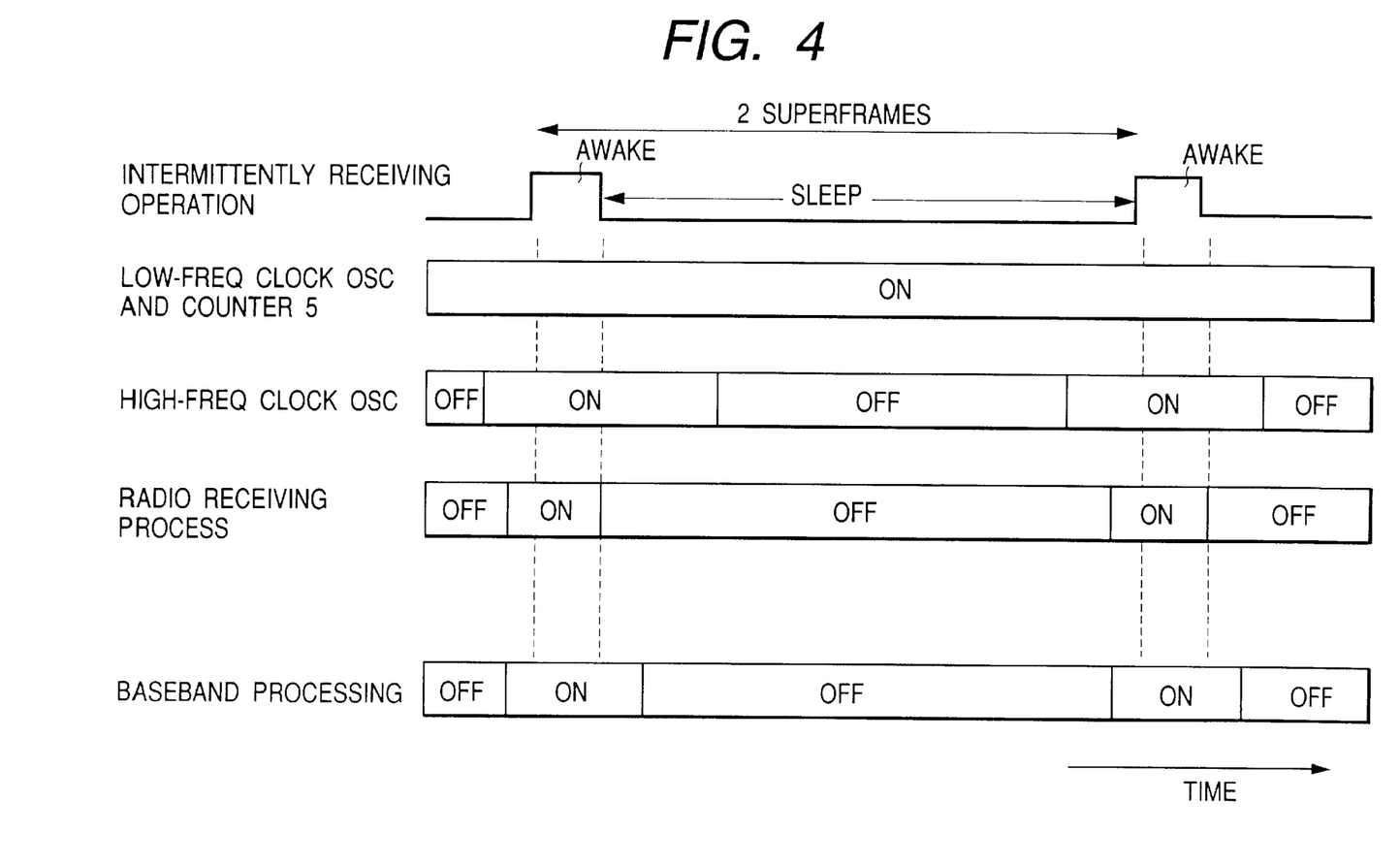
FIG. 4 is a time-domain diagram of states of circuits and processes in the radio communication device of FIG. 2.

With reference to FIG. 4, the intermittently receiving mode of operation of the system (the radio communication device of FIG. 2) has the alternation of an awake mode of operation and a sleep mode of operation. During the intermittently receiving mode of operation, the low-frequency clock oscillator 4 and the counter 5 continue to be in on states (active states). On the other hand, the high-frequency clock oscillator 1 periodically changes between an on state (an active state) and an off state (an inactive state). The high-frequency clock oscillator 1 changes to the on state before the sleep mode of operation of the system is replaced by the awake mode of operation of the system. The high-frequency clock oscillator 1 changes to the off state after the awake mode of operation of the system is replaced by the sleep mode of operation of the system. A radio-signal receiving process implemented by the transmission/reception processing unit 7 periodically changes between an on state (an active state) and an off state (an inactive state). The radio-signal receiving process by the transmission/reception processing unit 7 changes to the on state before the sleep mode of operation of the system is replaced by the awake mode of operation of the system but after the high-frequency clock oscillator 1 changes to the on state. The radio-signal receiving process by the transmission/reception processing unit 7 changes to the off state when the awake mode of operation of the system is replaced by the sleep mode of operation of the system.

Baseband processing implemented by the transmission/reception processing unit 7 periodically changes between an on state (an active state) and an off state (an inactive state). The baseband processing by the transmission/reception processing unit 7 changes to the on state before the sleep mode of operation of the system is replaced by the awake mode of operation of the system. The change of the baseband processing to the on state is concurrent with the change of the radio-signal processing to the on state. The baseband processing by the transmission/reception processing unit 7 changes to the off state after the awake mode of operation of the system is replaced by the sleep mode of operation of the system but before the high-frequency clock oscillator 1 changes to the off state.

The radio communication device of FIG. 2 has the following advantage over the prior-art power saving arrangement of FIG. 1. In the radio communication device of FIG. 2, the moment of the re-activation of the transmission/reception processing unit 7 is controlled in response to the fractional part of the value "Q". Thus, it is possible to vary the timing of the re-activation of the transmission/reception processing unit 7 by a unit shorter than the period of the low-frequency clock signal. Accordingly, the radio communication device of FIG. 2 provides finer timing control regarding the re-activation of the transmission/reception processing unit 7.

Second Embodiment

Figure 5:
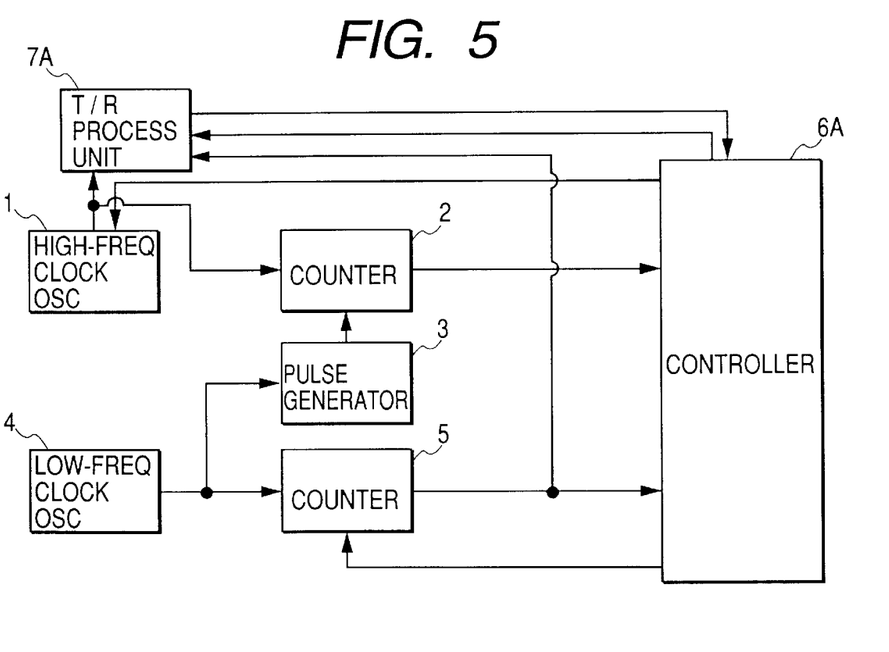
FIG. 5 is a block diagram of a portion of a radio communication device according to a second embodiment of this invention.

FIG. 5 shows a second embodiment of this invention which is similar to the embodiment of FIG. 2 except for design changes indicated hereinafter. The embodiment of FIG. 5 includes a controller 6A and a transmission/reception processing unit 7A instead of the controller 6 and the transmission/reception 20 processing unit 7 of FIG. 1 respectively. In the embodiment of FIG. 5, the counter 5 is connected to the transmission/reception processing unit 7A. In the embodiment of FIG. 5, the counter 5 periodically outputs a re-activation signal to the controller 6A and the transmission/reception processing unit 7A.

The transmission/reception processing unit 7A is designed for CDMA (code division multiple access). The transmission/reception processing unit 7A restarts its operation in response to a re-activation signal fed from the counter 5.

Figure 6:
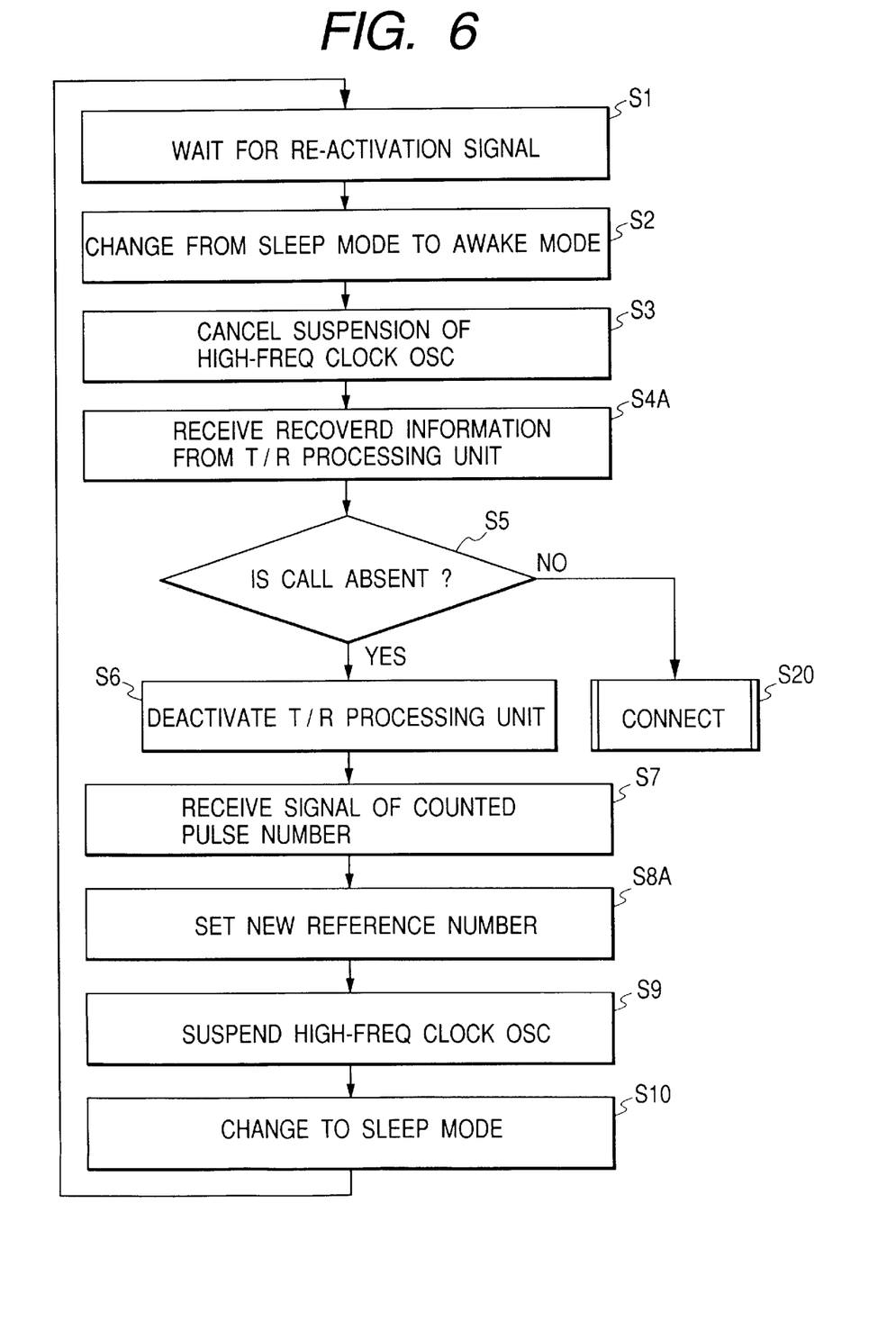
FIG. 6 is a flowchart of a segment of a program related to a controller in FIG. 5.

The controller 6A operates in accordance with a program stored in its internal ROM. FIG. 6 is a flowchart of a segment of the program related to the controller 6A. The program segment in FIG. 6 is similar to the program segment in FIG. 3 except for design changes indicated hereinafter. The program segment in FIG. 6 includes steps S4A and S8A instead of the steps S4 and S8 in FIG. 3 respectively.

The step S4A follows the step S3 and precedes the step S5. The step S4A receives a baseband signal from the transmission/reception processing unit 7A.

The step S8A follows the step S7 and precedes the step S9. The step S8A calculates a ratio between the counted pulse number and the predetermined pulse number (equal to, for example, 687,500=25×27,500). The predetermined pulse number corresponds to a condition where an error is absent from the frequency of the low-frequency clock signal with respect to the frequency of the high-frequency clock signal. Then, the step S8A calculates a mean frequency error or an average frequency error "n" of the low-frequency clock signal per pulse of the low-frequency clock signal from the calculated pulse-number ratio. Specifically, the mean frequency error "n" is expressed as "n=Cp/Pp" where "Cp" denotes the counted pulse number and "Pp" denotes the predetermined pulse number (equal to, for example, 687,500=25 ×27,500). In this case, the actual frequency of the low-frequency clock signal is given by "500·n" kHz. The step S8A calculates a value "Q" which is expressed as "Q=L·500·n" where "L" denotes a desired time interval measured by the counter 5. The value "Q" is composed of an integral part and a fractional part. The step S8A compares the fractional part of the value "Q" with a time of the width of a window for a multiple-path search implemented by the transmission/reception processing unit 7A. When the fractional part of the value "Q" is equal to or greater (longer) than the search window width time, the step S8A implements a first sequence of processes. On the other hand, when the fractional part of the value "Q" is smaller (shorter) than the search window width time, the step S8A implements a second sequence of processes.

During the first sequence of processes, the step S8A sets a new reference number to the integral part of the value "Q". The step S8A loads the counter 5 with information of the new reference number.

During the second sequence of processes, the step S8A sets a new reference number equal to the integral part of the value "Q" minus "1". This results in an earlier timing at which the counter 5 outputs a next re-activation signal. The step S8A loads the counter 5 with information of the new reference number.

As previously indicated, the transmission/reception processing unit 7A restarts its operation in response to a re-activation signal fed from the counter 5. When restarting, the transmission/reception processing unit 7A implements the re-acquisition (the re-establishment) of chip synchronization and the assignment of RAKE fingers as preparations for the awake mode of operation. In addition, the transmission/reception processing unit 7A implements a parallel search by a plurality of sliding correlators, demodulating signals of multiple paths and executing a RAKE combining process to provide a combination-resultant signal. The transmission/reception processing unit 7A derives a baseband signal from the combination-resultant signal. The transmission/reception processing unit 7A outputs the baseband signal to the controller 6A.

A frequency error of the low-frequency clock signal with respect to the high-frequency clock signal is corrected as in the embodiment of FIG. 1. This frequency error correction enables the transmission/reception processing unit 7A to reliably implement RAKE reception.

What is claimed is:

1. A receiving portion of a radio communication device, comprising:
    a circuit periodically moving into a sleep mode of operation, the circuit periodically moving out of the sleep mode of operation in response to a re-activation signal;
    first means for generating a first clock signal;
    second means for counting clock pulses in the first clock signal and generating the re-activation signal each time the number of the counted clock pulses in the first clock signal reaches an updatable number;
    third means for generating a second clock signal having a frequency higher than a frequency of the first clock signal;
    fourth means for counting clock pulses in the second clock signal during every time interval determined by the first clock signal;
    fifth means for calculating an error of the frequency of the first clock signal with respect to the frequency of the second clock signal on the basis of a result of the counting by the fourth means; and
    sixth means for setting the updatable number in response to the error calculated by the fifth means.

2. A receiving portion as recited in claim 1, further comprising:
    a reception processing unit;
    seventh means for activating the third means in response to the re-activation signal and then activating the reception processing unit at a moment which follows a moment of the activation of the third means by an updatable time; and
    eighth means for setting the updatable time in response to the error calculated by the fifth means.

3. A receiving portion as recited in claim 1, further comprising a reception processing unit periodically moving into a sleep mode of operation, the reception processing unit periodically moving out of the sleep mode of operation in response to the re-activation signal.

4. A receiving portion as recited in claim 3, further comprising:
    seventh means for comparing a segment of the error calculated by the fifth means with a predetermined value corresponding to a multiple-path search window width used in the reception processing unit; and
    eighth means for changing the updatable number in response to a result of the comparing by the seventh means.

5. A receiving portion of a radio communication device, comprising:
    a circuit periodically moving into a sleep mode of operation, the circuit periodically moving out of the sleep mode of operation in response to a re-activation signal;
    first means for generating a first clock signal;
    a frequency divider for generating a second clock signal in response to the first clock signal generated by the first means, the second clock signal having a frequency lower than a frequency of the first clock signal;
    second means for counting clock pulses in the first clock signal and generating the re-activation signal each time the number of the counted clock pulses in the first clock signal reaches an updatable number;
    third means for generating a third clock signal having a frequency higher than the frequency of the first clock signal;
    fourth means for counting clock pulses in the third clock signal during every time interval determined by the second clock signal;
    fifth means for calculating an error of the frequency of the first clock signal with respect to the frequency of the third clock signal on the basis of a result of the counting by the fourth means; and
    sixth means for setting the updatable number in response to the error calculated by the fifth means.

6. A receiving portion as recited in claim 5, further comprising:

a reception processing unit;

seventh means for activating the third means in response to the re-activation signal and then activating the reception processing unit at a moment which follows a moment of the activation of the third means by an updatable time; and eighth means for setting the updatable time in response to the error calculated by the fifth means.

7. A receiving portion as recited in claim 5, further comprising a reception processing unit periodically moving into a sleep mode of operation, the reception processing unit periodically moving out of the sleep mode of operation in response to the re-activation signal.

8. A receiving portion as recited in claim 7, further comprising:

seventh means for comparing a segment of the error calculated by the fifth means with a predetermined value corresponding to a multiple-path search window width used in the reception processing unit; and eighth means for changing the updatable number in response to a result of the comparing by the seventh means.

9. A receiving portion of a radio communication device, comprising:

a controller periodically moving into a sleep mode of operation, the controller periodically moving out of the sleep mode of operation in response to a re-activation signal;

first means for generating a first clock signal;

second means for counting clock pulses in the first clock signal and generating the re-activation signal each time the number of the counted clock pulses in the first clock signal reaches an updatable number;

third means for generating a second clock signal having a frequency higher than a frequency of the first clock signal; and fourth means for counting clock pulses in the second clock signal during every time interval determined by the first clock signal;

wherein the controller comprises fifth means for calculating an error of the frequency of the first clock signal with respect to the frequency of the second clock signal on the basis of a result of the counting by the fourth means, and sixth means for setting the updatable number in response to the error calculated by the fifth means.

10. A receiving portion of a radio communication device, comprising:

a circuit periodically moving into a sleep mode of operation, the circuit periodically moving out of the sleep mode of operation in response to a re-activation signal;

first means for generating a first clock signal;

second means for generating a second clock signal having a frequency higher than a frequency of the first clock signal, the second clock signal having a frequency accuracy higher than a frequency accuracy of the first clock signal;

third means for periodically detecting a relation between the frequency of the first clock signal and the frequency of the second clock signal; and fourth means for periodically generating the re-activation signal in response to the first clock signal at a timing depending on the relation detected by the third means.

* * * * *